(12) United States Patent
Singh et al.

(10) Patent No.: US 8,841,952 B1
(45) Date of Patent: Sep. 23, 2014

(54) DATA RETENTION FLIP-FLOP

(71) Applicants: Nitin Singh, Delhi (IN); Amit Jindal, Sonipat (IN); Anurag Jindal, Patiala (IN)

(72) Inventors: Nitin Singh, Delhi (IN); Amit Jindal, Sonipat (IN); Anurag Jindal, Patiala (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/902,974

(22) Filed: May 27, 2013

(51) Int. Cl.
*H03K 3/289* (2006.01)
*H03K 3/037* (2006.01)

(52) U.S. Cl.
CPC ............ *H03K 3/0375* (2013.01); *H03K 3/0372* (2013.01)
USPC ................................ 327/202; 326/93; 702/119

(58) Field of Classification Search
USPC ........................ 327/202–215, 218; 326/93, 46; 714/726–731; 716/106–112, 136; 702/119
See application file for complete search history.

(56) References Cited

U.S. PATENT DOCUMENTS

| 5,257,223 | A   | * | 10/1993 | Dervisoglu | 365/154 |
|---|---|---|---|---|---|
| 7,038,494 | B2  | * | 5/2006  | Morton | 326/93 |
| 7,183,825 | B2  |   | 2/2007  | Padhye | |
| 7,269,780 | B2  |   | 9/2007  | Arima | |
| 7,328,385 | B2  | * | 2/2008  | Warren et al. | 714/726 |
| 7,796,445 | B1  | * | 9/2010  | Biyani et al. | 365/189.05 |
| 2009/0326854 | A1 | * | 12/2009 | Chakravadhanula et al. | 702/119 |
| 2011/0298517 | A1 | * | 12/2011 | Pal | 327/202 |

* cited by examiner

*Primary Examiner* — Lincoln Donovan
*Assistant Examiner* — Thomas Skibinski
(74) *Attorney, Agent, or Firm* — Charles Bergere

(57) ABSTRACT

An integrated circuit (IC) includes a flip-flop that stores data when the IC is in built-in self-test (BIST) mode. The flip-flop includes a master latch connected to a slave latch, which in turn is connected to a data retention latch. A control circuit is connected to the flip-flop. During normal operation, the master latch receives a data input signal, which is transmitted through the slave latch to another flip-flop of the IC. When the control circuit initiates BIST (scan testing), data stored in the slave latch is transferred to the data retention latch. Upon completion of BIST, the data stored in the retention latch is used to restore the flip-flop to its original state.

19 Claims, 3 Drawing Sheets

DATA RETENTION FLIP-FLOP

BACKGROUND OF THE INVENTION

The present invention relates generally to integrated circuits, and more particularly, to a flip-flop that retains data during scan testing.

Integrated circuits (ICs) such as microprocessors, microcontroller units (MCUs), systems-on-chips (SOCs), and application specific integrated circuits (ASICs) are widely used in various applications including industrial applications, automobiles, home appliances, and handheld devices. These ICs include circuit modules, such as hard and soft IP cores, digital circuits including latches, registers and combinational logic circuits. ICs often include a self-testing mechanism, referred to as logic built-in-self-test (LBIST), to enable self-checking of logic within the IC. For example, BIST procedures are often integrated in ISO 26262 standard compliant automotive electric and electronic devices where testing of safety features is crucial.

Transition fault testing is performed during BIST to identify and locate signal transition faults in the IC. The test, also known as an at-speed test, is carried out at rated clock speed to test the response of an IC. At-speed tests can be performed as scan tests that involve selecting a scan path (chain of flip-flops) in the IC for testing. An input test pattern of logic zero and one values is provided to a first-flop of the chain and a corresponding output pattern is obtained at the output of last flip-flop of the chain. Subsequently, the output pattern is compared with an expected output pattern to identify faults in the chain.

When LBIST is initiated on a selected circuit, the normal operation of the flip-flops of the circuit is halted and scan testing is performed. Upon completion of LBIST, each flip-flop is reset before resuming normal operation. Due to the sequence of operation, the values stored in each flip-flop (hereinafter referred to as original state) before scan testing are lost. Hence, upon completion of LBIST, each flip-flop of the chain resumes its normal operation from reset; no correlation is maintained with the original state. It is time consuming to return each flip-flop to its original state (rather than the reset state). This may not be desirable, especially for ICs that perform safety critical operations.

Therefore, it would be advantageous to have a flip-flop that retains the state before scan testing, that reduces the time required by the flip-flop to reach its original state after the completion of scan testing, and that generally overcomes the above-mentioned limitations in existing integrated circuits.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. It is to be understood that the drawings are not to scale and have been simplified for ease of understanding the invention.

DETAILED DESCRIPTION OF THE PRESENT INVENTION

Figure 1:
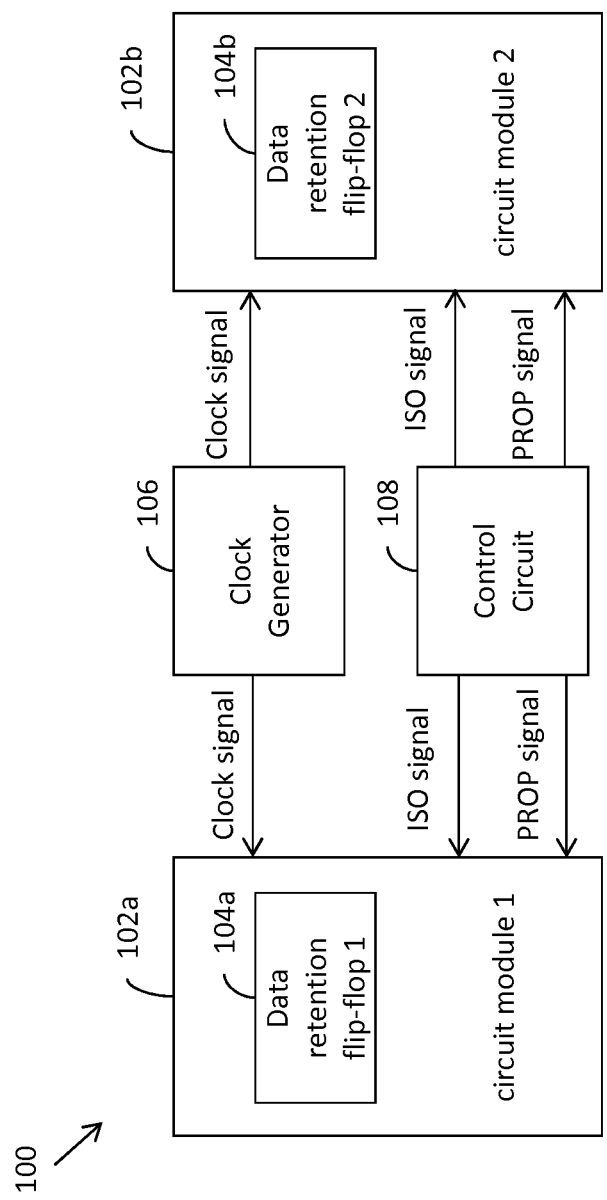
FIG. 1 is a schematic block diagram of an integrated circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein the terms multiplexer and mux may be used interchangeably.

In an embodiment of the present invention, a data retention flip-flop is provided. The data retention flip-flop includes first multiplexer, a master latch, a slave latch, a data retention latch and a second multiplexer. The first multiplexer has a first input terminal that receives an data input signal, a second input terminal that receives a scan input signal, and a select terminal that receives a test enable signal. The first multiplexer outputs the data input signal at an output terminal thereof during a normal operation mode of the data retention flip-flop. The master latch has an input terminal connected to the output terminal of the first multiplexer for receiving the data input signal, and a clock input terminal that receives a clock signal. The master latch outputs the data input signal at an output terminal thereof, during the normal operation mode of the data retention flip-flop. The slave latch has an input terminal connected to the output terminal of the master latch for receiving the data input signal, and a clock input terminal that receives the clock signal. The slave latch outputs the data input signal at an output terminal of thereof during the normal operation mode of the data retention flip-flop. The data retention latch has an input terminal connected to the output terminal of the slave latch for receiving the data input signal and a clock input terminal that receives an isolation (ISO) signal when the integrated circuit transitions from the normal operation mode to a scan testing mode. The data retention latch stores the data input signal during the scan testing mode of the integrated circuit. The second multiplexer has a first input terminal connected to an output terminal of the data retention latch for receiving the stored data input signal, a second input terminal connected to the output terminal of the slave latch for receiving the data input signal, and a select terminal that receives a propagation (PROP) signal. The second multiplexer outputs the stored data input signal when the integrated circuit transitions from the scan testing mode to a reload mode and outputs the data input signal at the output terminal of the second multiplexer, during the normal operation mode of the integrated circuit, based on the PROP signal.

The data retention flip-flop may be used in an integrated circuit such as a System on a Chip (SoC), microcontroller (MCU), etc.

Various embodiments of the present invention provide an integrated circuit that includes a plurality of data retention flip-flops for retaining data during scan testing of the integrated circuit. Each flip-flop includes master and slave latches and a data retention latch. When the scan testing is initiated, input data from the slave latch is transmitted to the data retention latch. The data retention latch holds the input data until the scan testing is completed, and upon completion, the flip-flop is returned to its original output state. As the input data of the flip-flop is almost instantly restored, the need to reset the flip-flop and then restore it to its original state by scanning the original data back into the flip-flops by way of the scan chain or by way of other known hardware/software mechanisms is eliminated. This ensures efficient functioning of the overall integrated circuit, especially when the integrated circuit is used in high performance and safety critical applications.

Referring now to FIG. 1, a schematic block diagram of an integrated circuit (IC) 100, in accordance with an embodiment of the present invention is shown. Examples of the IC 100 include microprocessors, microcontroller units (MCUs), systems-on-chips (SOCs), and application specific integrated circuits (ASICs) which are widely used in various applications including industrial applications, automobiles, home appliances, and handheld devices. The IC 100 includes a plurality of circuit modules including first and second circuit modules 102a and 102b (hereinafter referred to as circuit module 102). Examples of circuit modules 102 include hard and soft IP cores, digital circuits including latches, registers and combinatorial logic circuits. Each circuit module 102 includes a plurality of data retention flip-flops 104. For illustration purposes, the first and second circuit modules 102a and 102b are shown to include first and second flip-flops 104a and 104b. The IC 100 further includes a clock generator 106 that provides a clock signal to clock terminals of the flip-flops 104. The IC 100 outputs a data input signal through the flip-flops 104 in a normal operation mode. The IC 100 further includes a control circuit 108 connected to each circuit module 102. The control circuit 108 selectively initiates built-in self-test (BIST) for scan testing of one or more circuit modules 102. The control circuit 108 provides an isolation signal (ISO) to the flip-flops 104 of the selected circuit module 102 when the circuit module 102 switches from the normal operation mode to the scan testing mode. Likewise, the control circuit 108 provides a propagate (PROP) signal to the flip-flops 104 of the selected circuit module 102, when the circuit module 102 switches from the scan testing mode to the normal operation mode.

Figure 2:
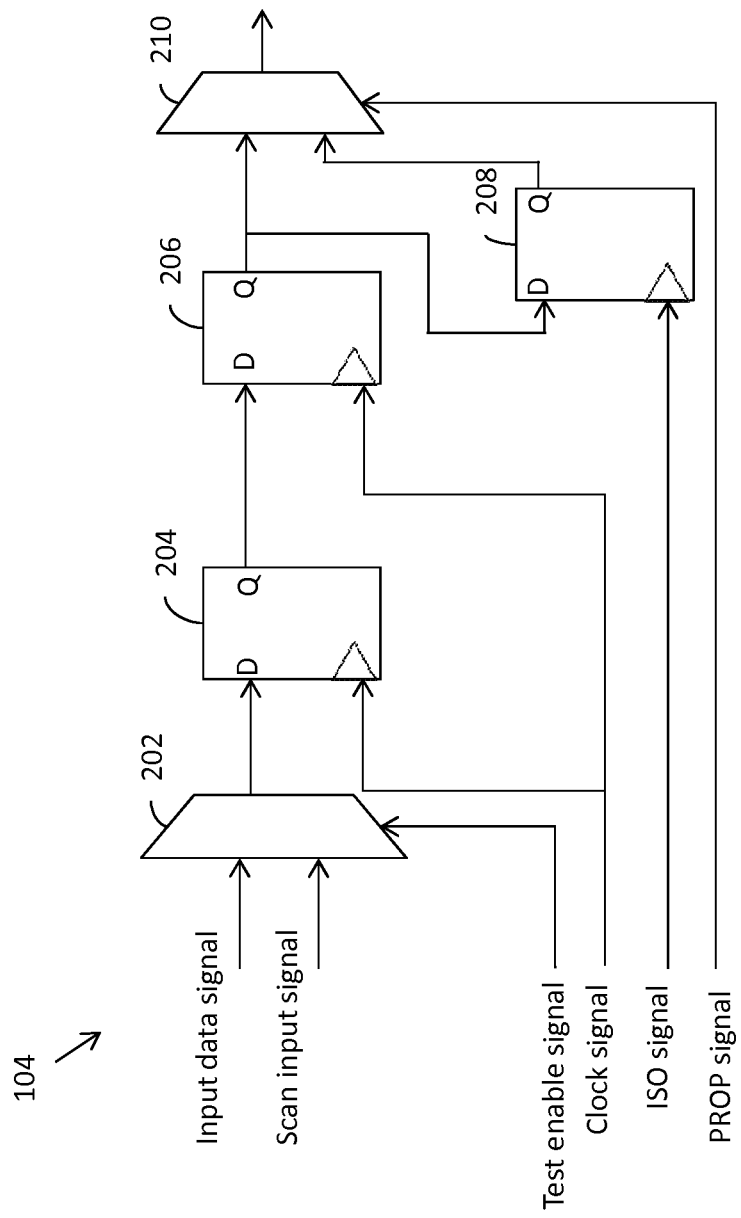
FIG. 2 is a schematic block diagram of a data retention flip-flop of the integrated circuit of FIG. 1 in accordance with an embodiment of the present invention.

Referring now to FIG. 2, a schematic diagram of the data retention flip-flop 104 in accordance with an embodiment of the present invention is shown. The flip-flop 104 includes a first multiplexer or mux 202, master and slave latches 204 and 206, a data retention latch 208, and a second mux 210. The first mux 202 has a first input terminal that receives the data input signal, a second input terminal that receives a scan input (SI) signal, and a select terminal that receives a test enable signal from the control circuit 108. An output terminal of the first mux 202 is connected to a data input terminal of the master latch 204. The master latch 204 has a clock terminal that receives the clock signal generated by the clock generator 104. An output terminal of the master latch 204 is connected to a data input terminal of the slave latch 206. A clock terminal of the slave latch 206 receives the clock signal from the clock generator 104, and an output terminal of the slave latch 206 is connected to a data input terminal of the data retention latch 208 and a first input terminal of the second mux 210. A clock terminal of the data retention latch 208 receives the ISO signal from the control circuit 108. An output terminal of the data retention latch 208 is connected to a second input terminal of the second mux 210. A select terminal of the second mux 210 receives the PROP signal from the control circuit 108.

Figure 3:
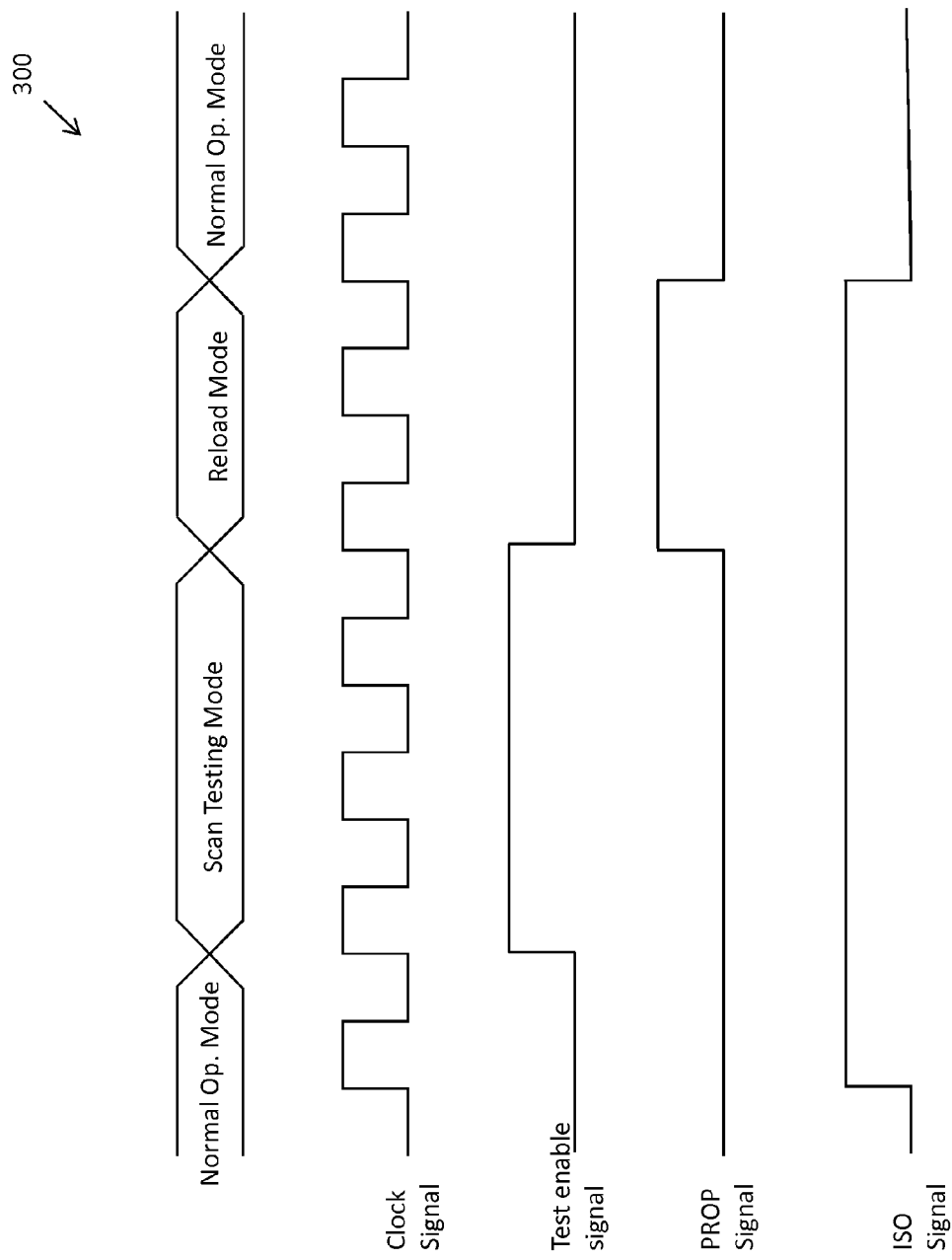
FIG. 3 is a timing diagram of various signals of the data retention flip-flop of FIG. 2 in accordance with an embodiment of the present invention.

The operation of the data retention flip-flop 104 will be explained with reference to a timing diagram 300, which shows the clock signal, test enable signal, and the ISO and PROP signals, as illustrated in FIG. 3. During the normal operation mode of the integrated circuit 100, the test enable signal is de-asserted and the first mux 202 receives and outputs the data input signal to the master latch 204. Thereafter, at a positive edge of the clock signal, the data input signal is first transmitted from the master latch 204 to the slave latch 206, and then from the slave latch 206 to the first input terminal of the second mux 210. The control circuit 108 de-asserts the ISO signal which makes the slave latch 206 remain inactive. The control circuit 108 further de-asserts the PROP signal causing the second mux 210 to transmit the data input signal to an input terminal of a subsequent flip-flop 104 (not shown) of the circuit module 102.

When BIST is initiated on the circuit module 102, the control circuit 108 initially asserts the ISO signal, which causes the data retention latch 208 to receive and latch the data input signal value from the slave latch 206. Thereafter, the test enable signal is asserted at the next positive edge of the clock signal which causes the first mux 202 to select and transmit the SI signal (indicating beginning of scan testing). It will be apparent to those skilled in the art that the SI and test enable signals may be generated by an external testing apparatus (not shown) that is used for scan testing the flip-flops 104. The master, slave, and data retention latches 204, 206 and 208 each function in a similar fashion as that during the normal operation mode. The PROP signal remains de-asserted, which causes the second mux 210 to receive and transmit the SI signal to the subsequent flip-flop 104.

When the control circuit 108 receives an indication from the external testing apparatus of completion of scan testing (by de-asserting the test enable signal), then the control circuit 108 asserts the PROP signal and the circuit module 102 transitions from the scan testing mode to a reload mode. In the reload mode, the second mux 210 receives the data input signal value stored by the data retention latch 208 and outputs the data input signal value to the next flip-flop 104. The control circuit 108 then de-asserts the ISO and PROP signals and the flip-flop 104 is restored to the normal operation mode. Thus, each flip-flop 104 is restored to its original output data value, which prevents loss of system critical data.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A data retention flip-flop, comprising:
    a first multiplexer having a first input terminal that receives a data input signal, a second input terminal that receives a scan input signal, and a select terminal that receives a test enable signal, wherein the first multiplexer outputs the data input signal at an output terminal thereof in a normal operation mode of the data retention flip-flop;
    a master latch having a data input terminal connected to the output terminal of the first multiplexer for receiving the data input signal, and a clock input terminal that receives a clock signal, wherein the master latch outputs the data input signal at an output terminal thereof at a first edge of the clock signal in the normal operation mode;
    a slave latch having a data input terminal connected to the output terminal of the master latch for receiving the data input signal, and a clock input terminal that receives the clock signal, wherein the slave latch outputs the data input signal at an output terminal thereof at the first edge of the clock signal in the normal operation mode;
    a data retention latch having a data input terminal connected to the output terminal of the slave latch for receiving the data input signal and a clock input terminal that receives an isolation (ISO) signal, wherein the ISO signal is asserted when the data retention flip-flop transitions from the normal operation mode to a scan testing mode such that the data retention latch stores the data input signal during the scan testing mode; and a second multiplexer having a first input terminal connected to an output terminal of the data retention latch for receiving the stored data input signal, a second input terminal connected to the output terminal of the slave latch for receiving the data input signal, and a select terminal that receives a propagation (PROP) signal, wherein the second multiplexer outputs the stored data input signal when the data retention flip-flop transitions from the scan testing mode to a reload mode, and outputs the data input signal during the normal operation mode.

2. The data retention flip-flop of claim 1, wherein when the ISO signal is de-asserted, the data retention flip-flop transitions from the reload mode to the normal operation mode.

3. The data retention flip-flop of claim 1, wherein the PROP signal is de-asserted during the scan testing and normal operation modes and asserted when the data retention flip-flop transitions from the scan testing mode to the reload mode.

4. The data retention flip-flop of claim 1, wherein the PROP signal is de-asserted after the stored data input signal is output by the second multiplexer.

5. The data retention flip-flop of claim 1, wherein the test enable signal is asserted in the scan testing mode and de-asserted in the normal operation mode.

6. The data retention flip-flop of claim 1, wherein the data retention flip-flop receives the clock signal from an external clock generator.

7. The data retention flip-flop of claim 1, wherein the data retention flip-flop receives the ISO and PROP signals from an external control circuit.

8. An integrated circuit, comprising:
a plurality of flip-flops, wherein each flip-flop includes:
a first multiplexer having a first input terminal that receives a data input signal, a second input terminal that receives a scan input signal, and a select terminal that receives a test enable signal, wherein the first multiplexer outputs the data input signal at an output terminal thereof during a normal operation mode of the integrated circuit;
a master latch having a data input terminal connected to the output terminal of the first multiplexer for receiving the data input signal, and a clock input terminal that receives a clock signal, wherein the master latch outputs the data input signal at an output terminal thereof at a first edge of the clock signal in the normal operation mode;
a slave latch having a data input terminal connected to the output terminal of the master latch for receiving the data input signal, and a clock input terminal that receives the clock signal, wherein the slave latch outputs the data input signal at an output terminal thereof at the first edge of the clock signal in the normal operation mode;
a data retention latch having a data input terminal connected to the output terminal of the slave latch for receiving the data input signal and a clock input terminal that receives an isolation (ISO) signal, wherein the ISO signal is asserted when the integrated circuit transitions from the normal operation mode to a scan testing mode such that the data retention latch stores the data input signal in the scan testing mode; and a second multiplexer having a first input terminal connected to an output terminal of the data retention latch for receiving the stored data input signal, a second input terminal connected to the output terminal of the slave latch for receiving the data input signal, and a select terminal that receives a propagation (PROP) signal, wherein the second multiplexer outputs the stored data input signal when the integrated circuit transitions from the scan testing mode to a reload mode, and outputs the data input signal during the normal operation mode.

9. The integrated circuit of claim 8, wherein the ISO signal is de-asserted when the integrated circuit transitions from the reload mode to the normal operation mode.

10. The integrated circuit of claim 8, wherein the PROP signal is de-asserted during the scan testing and normal operation modes and asserted when the integrated circuit transitions from the scan testing mode to the reload mode.

11. The integrated circuit of claim 8, wherein the PROP signal is de-asserted after the stored data input signal is transmitted by the second multiplexer.

12. The integrated circuit of claim 8, wherein the test enable signal is asserted in the scan testing mode and de-asserted in the normal operation mode.

13. The integrated circuit of claim 8, further comprising a clock generator for generating the clock signal.

14. The integrated circuit of claim 13, further comprising a control circuit for generating the ISO and PROP signals.

15. An integrated circuit, comprising:
a clock generator for generating a clock signal;
a control circuit for generating an isolation (ISO) signal and a propagation (PROP) signal; and
a plurality of circuit modules, wherein each circuit module includes a plurality of flip-flops, and wherein each flip-flop includes:
a first multiplexer having a first input terminal that receives a data input signal, a second input terminal that receives a scan input signal, and a select terminal that receives a test enable signal, wherein the first multiplexer outputs the data input signal at an output terminal thereof during a normal operation mode of the integrated circuit;
a master latch having an input terminal connected to the output terminal of the first multiplexer for receiving the data input signal, and a clock input terminal connected to the clock generator for receiving the clock signal, wherein the master latch outputs the data input signal at an output terminal thereof at a first edge of the clock signal in the normal operation mode;
a slave latch having an input terminal connected to the output terminal of the master latch for receiving the data input signal, and a clock input terminal connected to the clock generator for receiving the clock signal, wherein the slave latch outputs the data input signal at an output terminal thereof at the first edge of the clock signal in the normal operation mode;
a data retention latch having an input terminal connected to the output terminal of the slave latch for receiving the data input signal, and a clock input terminal connected to the control circuit for receiving the ISO signal, wherein the ISO signal is asserted when the integrated circuit transitions from the normal operation mode to a scan testing mode such that the data retention latch stores the data input signal during the scan testing mode; and
a second multiplexer having a first input terminal connected to an output terminal of the data retention latch for receiving the stored data input signal, a second input terminal connected to the output terminal of the slave latch for receiving the data input signal, and a select terminal connected to the control circuit for receiving the PROP signal, wherein the second multiplexer outputs the stored data input signal when the integrated circuit transitions from the scan testing mode to a reload mode, and outputs the data input signal in the normal operation mode.

16. The integrated circuit of claim 15, wherein the control circuit de-asserts the ISO signal when the integrated circuit transitions from the reload mode to the normal operation mode.

17. The integrated circuit of claim 15, wherein the control circuit de-asserts the PROP signal in the scan testing and normal operation modes and asserts the PROP signal when the integrated circuit transitions from the scan testing mode to the reload mode.

18. The integrated circuit of claim 17, wherein the control circuit de-asserts the PROP signal after the stored data input signal is output by the second multiplexer.

19. The integrated circuit of claim 15, wherein the test enable signal is asserted in the scan testing mode of the integrated circuit and de-asserted during the normal operation mode.

* * * * *